(12) United States Patent
Eder et al.

(10) Patent No.: US 11,295,996 B2
(45) Date of Patent: Apr. 5, 2022

(54) SYSTEMS AND METHODS FOR BONDING SEMICONDUCTOR ELEMENTS

(71) Applicant: Kulicke and Soffa Industries, Inc., Fort Washington, PA (US)

(72) Inventors: James E. Eder, Doylestown, PA (US); David C. Schalcosky, North Wales, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 16/872,633

(22) Filed: May 12, 2020

(65) Prior Publication Data
US 2020/0273759 A1  Aug. 27, 2020

Related U.S. Application Data

(60) Continuation of application No. 15/830,164, filed on Dec. 4, 2017, now Pat. No. 10,692,783, which is a
(Continued)

(51) Int. Cl.
*B32B 41/00* (2006.01)
*H01L 21/66* (2006.01)
(Continued)

(52) U.S. Cl.
CPC ............ *H01L 22/20* (2013.01); *H01L 23/544* (2013.01); *H01L 24/75* (2013.01); *H01L 24/81* (2013.01);
(Continued)

(58) Field of Classification Search
CPC ....... H01L 22/20; H01L 24/75; H01L 23/544; H01L 2224/75744; H01L 2224/75734;
(Continued)

(56) References Cited

U.S. PATENT DOCUMENTS 7,209,583 B2 * 4/2007 Enokido ............ B23K 37/0408
228/103
2004/0261947 A1  12/2004 Haraguchi et al.
(Continued)

FOREIGN PATENT DOCUMENTS

CN          101326457         12/2008

*Primary Examiner* — Michael N Orlando
*Assistant Examiner* — Joshel Rivera
(74) *Attorney, Agent, or Firm* — Christopher M. Spletzer, Sr.

(57) ABSTRACT

A bonding machine for bonding semiconductor elements, the bonding machine including: a support structure for supporting a substrate; a bond head assembly, the bond head assembly including a bonding tool configured to bond a plurality of semiconductor elements to the substrate; an alignment structure including first alignment markings; an alignment element configured to be placed on the alignment structure using the bonding tool, the alignment element including second alignment markings; an imaging system configured to image relative positions of the first alignment markings and corresponding ones of the second alignment markings; and a computer system configured to provide an adjustment to a position of at least one of the bonding tool and the support structure during bonding of ones of the plurality of semiconductor elements to the substrate, the computer being configured to provide the adjustment at least partially based on the relative positions of the first alignment markings and the corresponding ones of the second alignment markings, the adjustment being specific to bonding of the ones of the plurality of semiconductor elements to a corresponding region of the substrate.

16 Claims, 15 Drawing Sheets

Related U.S. Application Data division of application No. 14/553,049, filed on Nov. 25, 2014, now abandoned.

(60) Provisional application No. 61/911,226, filed on Dec. 3, 2013.

(51) Int. Cl.
*H01L 23/544* (2006.01)
*H01L 23/00* (2006.01)

(52) U.S. Cl.
CPC ............ *H01L 2223/54426* (2013.01); *H01L 2223/54486* (2013.01); *H01L 2224/16145* (2013.01); *H01L 2224/16225* (2013.01); *H01L 2224/16245* (2013.01); *H01L 2224/75343* (2013.01); *H01L 2224/75701* (2013.01); *H01L 2224/75734* (2013.01); *H01L 2224/75744* (2013.01); *H01L 2224/75753* (2013.01); *H01L 2224/75755* (2013.01); *H01L 2224/8118* (2013.01); *H01L 2224/81121* (2013.01); *H01L 2224/81203* (2013.01); *H01L 2224/81205* (2013.01); *H01L 2225/06513* (2013.01); *H01L 2225/06593* (2013.01); *H01L 2924/15311* (2013.01)

(58) Field of Classification Search
CPC ... H01L 2224/81121; H01L 2224/8118; H01L 2224/75343; H01L 2224/75701; H01L 2224/81205; H01L 2224/75753; H01L 2224/75755; H01L 2224/81203; H01L 2224/16245; H01L 2224/06593; H01L 2223/54486; H01L 2225/06513; H01L 2223/54426; H01L 2924/15311; H01L 24/81; H01L 2224/16145; H01L 2224/16225
USPC .................... 156/64, 350, 351, 378, 379
See application file for complete search history.

(56) References Cited

U.S. PATENT DOCUMENTS

2008/0245472 A1 10/2008 Hirata et al.
2016/0240420 A1 8/2016 Wagenleitner

* cited by examiner

SYSTEMS AND METHODS FOR BONDING SEMICONDUCTOR ELEMENTS

CROSS-REFERENCE TO RELATED APPLICATIONS

This application is a continuation of U.S. patent application Ser. No. 15/830,164, filed Dec. 4, 2017, which is a divisional of U.S. patent application Ser. No. 14/553,049, filed Nov. 25, 2014, which claims the benefit of U.S. Provisional Patent Application No. 61/911,226 filed Dec. 3, 2013, the content of each of which is incorporated herein by reference.

FIELD OF THE INVENTION

The present invention relates to the formation of semiconductor packages, and more particularly, to improved systems and methods for bonding semiconductor elements to bonding locations.

BACKGROUND OF THE INVENTION

In certain aspects of the semiconductor packaging industry, semiconductor elements are bonded to bonding locations. For example, in conventional die attach applications (also known as die bonding), a semiconductor die is bonded to a bonding location (e.g., a leadframe, another die in stacked die applications, a spacer, etc.). In advanced packaging applications (e.g., flip chip bonding, thermocompression bonding), semiconductor elements (e.g., bare semiconductor die, packaged semiconductor die, etc.) are bonded to bonding locations, with conductive structures (e.g., conductive bumps, contact pads, solder bumps, conductive pillars, copper pillars, etc.) disposed therebetween.

It is desirable that bonding machines (e.g., thermocompressive bonding machines, thermosonic bonding machines, ultrasonic bonding machines, etc.) be configured to accurately place and bond a semiconductor element to a bonding location. However, various inaccuracies and error sources exist in such bonding machines. Such inaccuracies and error sources are not identical from machine to machine, or from application to application. This results in challenges to the machine user and/or operator to consistently and accurately place and bond semiconductor elements.

Thus, it would be desirable to provide improved systems for, and methods of, bonding semiconductor elements to bonding locations.

SUMMARY OF THE INVENTION

According to an exemplary embodiment of the present invention, a bonding machine for bonding semiconductor elements includes: (1) a support structure for supporting a substrate; (2) a bond head assembly, the bond head assembly including a bonding tool configured to bond a plurality of semiconductor elements to the substrate; (3) an alignment structure including first alignment markings; (4) an alignment element configured to be placed on the alignment structure using the bonding tool, the alignment element including second alignment markings; (5) an imaging system configured to image relative positions of the first alignment markings and corresponding ones of the second alignment markings; and (6) a computer system configured to provide an adjustment to a position of at least one of the bonding tool and the support structure during bonding of ones of the plurality of semiconductor elements to the substrate, the computer being configured to provide the adjustment at least partially based on the relative positions of the first alignment markings and the corresponding ones of the second alignment markings, the adjustment being specific to bonding of the ones of the plurality of semiconductor elements to a corresponding region of the substrate.

According to another exemplary embodiment of the present invention, a method of operating a bonding machine is provided. The bonding machine includes a bonding tool configured to bond a semiconductor element to a substrate. The method includes the steps of: (a) providing an alignment structure on the bonding machine, the alignment structure including a plurality of first alignment markings; (b) selecting an area of the alignment structure based on a region of the substrate to be bonded with the semiconductor element, the substrate configured to be supported by a support structure of the bonding machine; (c) imaging ones of second alignment markings on an alignment element along with ones of the first alignment markings on the area of the alignment structure; and (d) adjusting a position of at least one of the bonding tool and the support structure during a subsequent bonding process using information provided from step (c).

According to another exemplary embodiment of the present invention, a method of bonding a plurality of semiconductor elements to a substrate with a bonding tool is provided. The method includes the steps of: (a) placing an alignment element over each of a plurality of areas of an alignment structure, each of the plurality of areas corresponding to one of a plurality of regions of a substrate supported by a support structure; (b) determining an offset of the alignment element with respect to each of the plurality of areas; and (c) adjusting a position of at least one of (1) the bonding tool and (2) the support structure during bonding of a plurality of semiconductor elements to each of the plurality of regions of the substrate, the position adjustment for each of the plurality of regions being related to the offset determined for the area corresponding to each of the plurality of regions.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

Figure 1A:
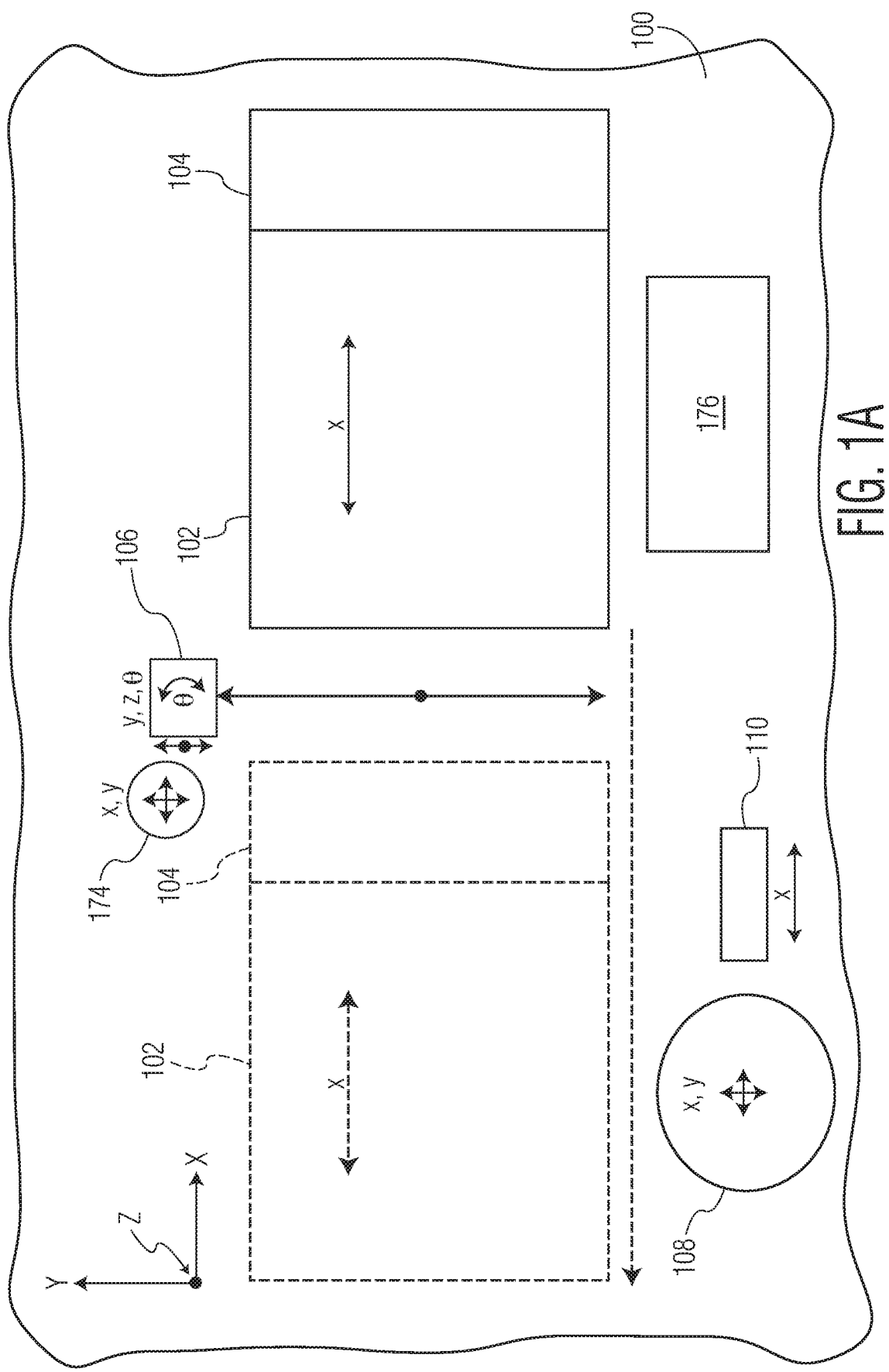
FIG. 1A is a block diagram top view of a portion of a bonding machine for bonding semiconductor elements to a substrate in accordance with an exemplary embodiment of the present invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor wafer, a BGA substrate, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, an interposer, etc.).

In accordance with certain exemplary embodiments of the present invention, if an alignment element placed using a bonding tool is misaligned with a portion of a bonding machine alignment structure over which it is placed (where misalignment is determined, for example, using predetermined criteria such as a predetermined degree of misalignment), positions of a bonding tool (and/or a support structure of a substrate) are adjusted, based upon the misalignment, during bonding of semiconductor elements to bonding locations in a corresponding region (e.g., a row of bonding locations) of the substrate. An imaging system images the alignment element over the portion of the alignment structure and the misalignment is determined based upon the image(s) using a computer system of the bonding machine. Such adjustment provides for improved bonding accuracy as compared to conventional methods.

As will be appreciated by those skilled in the art, a thermocompression bonding machine (such as machine 100 in FIG. 1A, or any of the other machine embodiments described herein) may include many elements not shown in the drawings herein for simplicity. Exemplary elements include, for example: input elements for providing input workpieces (i.e., substrates) to be bonded with additional semiconductor elements; output elements for receiving processed workpieces that now include additional semiconductor elements; transport systems for moving workpieces; imaging systems for imaging and alignment of workpieces; a bond head assembly carrying the bonding tool; a motion system for moving the bond head assembly; a computer system including software for operating the machine; amongst other elements.

FIG. 1A illustrates portions of bonding machine 100 (e.g., a thermocompressive bonding machine, a thermosonic bonding machine, an ultrasonic bonding machine, etc.) including support structure 102 (e.g., a shuttle, a heated shuttle, a heat block, an anvil, etc.) and alignment structure 104. Alignment structure 104 is secured to (either directly or indirectly), or integrated with, support structure 102. Thus, when support structure 102 moves (e.g., along the x-axis shown in FIG. 1A, or in any other direction as desired) alignment structure 104 moves with support structure 102.

Bonding machine 100 also includes bond head assembly 106 (illustrated as moving along the y and z axes—see the legend, as well as about a theta (θ) axis—but may move in other directions, as desired), semiconductor element source 108 (e.g., a semiconductor wafer), and pick tool 110 (illustrated as moving along the x axis—but may move in other directions, as desired). In an exemplary operation, pick tool 110 removes a semiconductor element (e.g., a bare die) from source 108. Pick tool 110, with the semiconductor element, moves along the x-axis to a transfer position (not shown). Bond head assembly 106 also moves to the transfer position, where the semiconductor element is transferred from pick tool 110 to a place tool (e.g., a bonding tool 106a, not shown in FIG. 1A, but see FIG. 6A) carried by bond head assembly 106. Support structure 102 is aligned in a given position along its x-axis range of motion (e.g., see the dash-line position of support structure 102 and alignment structure 104 along the x-axis). Bond head assembly 106 moves along the y-axis to a position above a bonding location of a substrate supported by support structure 102. Bond head assembly 106 is lowered along the z-axis such that the bonding tool is able to bond the semiconductor element to the bonding location of the substrate. This process may be repeated such that a number of semiconductor elements from semiconductor element source 108 may be bonded to respective bonding locations on the substrate. Bonding machine 100 also includes imaging system 174 (illustrated as moving along the x and y axes—but may move in other directions, as desired) and computer system 176. As will be appreciated by those skilled in the art, imaging system 174 (e.g., including at least one camera) is configured for use in determining proper placement and alignment of the semiconductor elements to respective bonding locations on the substrate as will be described herein. Computer system 176 obtains information from imaging system 174, and determines any adjustment of the bonding tool and/or the support structure position as set forth herein (e.g., using algorithms and the like).

Figure 1B:
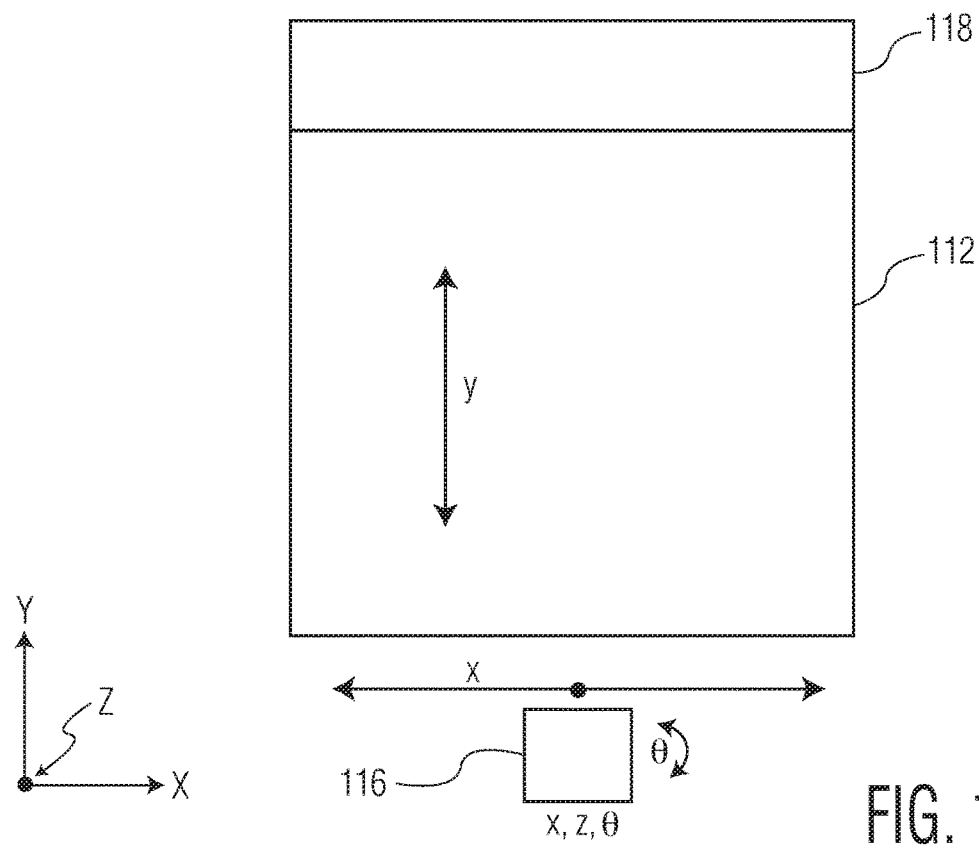
FIGS. 1B-1C are block diagrams of alternate structures for a portion of the bonding machine of FIG. 1A.
Figure 1C:
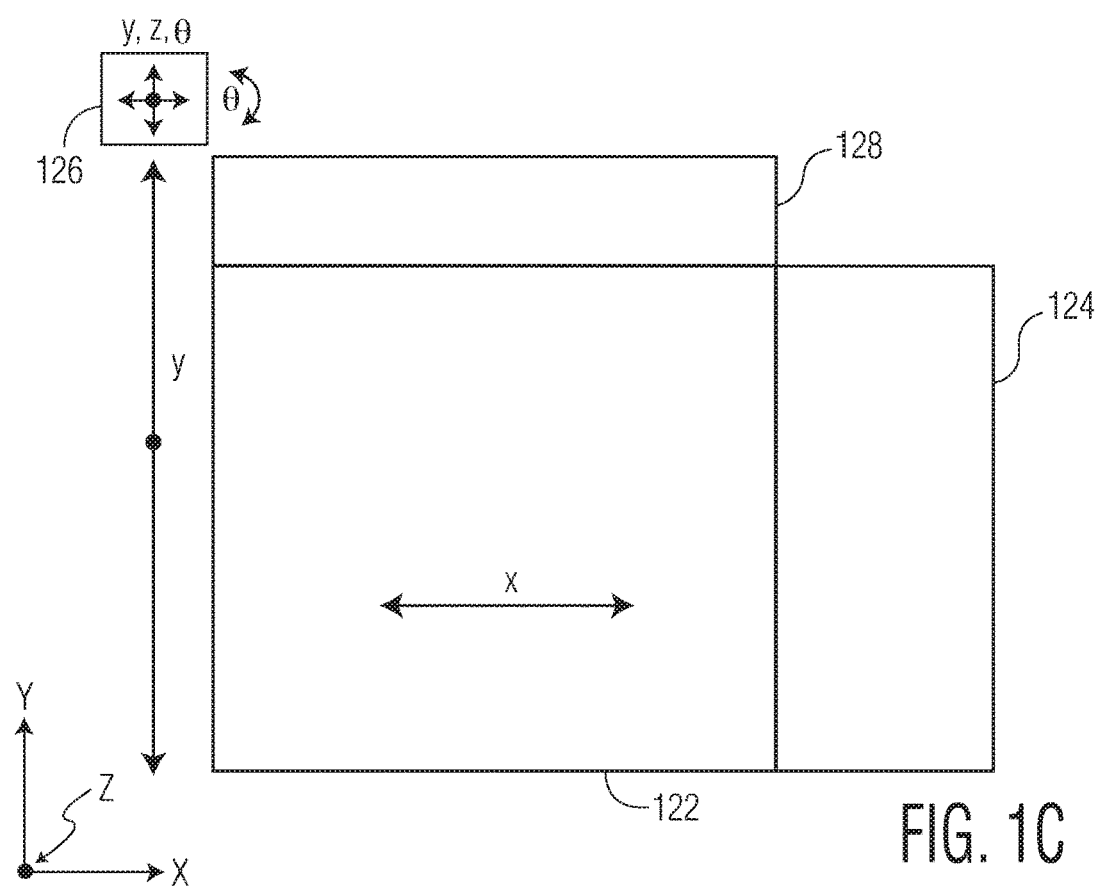

The directions of motion (e.g., along x, y, and z-axes, and rotation about the theta (θ) axis) shown in FIG. 1A (and the other drawings herein) are exemplary in nature. Additional or different motion axes or directions may be utilized by the various elements. For example, FIG. 1A illustrates an exemplary configuration where support structure 102 moves along an x-axis, and wherein alignment structure 104 is positioned on an end of support structure 102 along this x-axis. Of course, alternative configurations are contemplated. In FIG. 1B, support structure 112 moves along a y-axis (and bond head assembly 116 moves along an x-axis, a z-axis, and about a theta (θ) axis), and alignment structure 118 is positioned on an end of support structure 112 along this y-axis. In FIG. 1C, two different alignment structures 124, 128 secured to (either directly or indirectly), or integrated with, support structure 122, are provided. Support structure 122 moves along an x-axis (and bond head assembly 126 moves along an a y-axis, a z-axis, and about a theta axis), and alignment structure 124 is positioned on an end of support structure 122 along this x-axis. Another alignment structure 128 is positioned on another end of support structure 122 along a y-axis as illustrated.

Figure 2A:
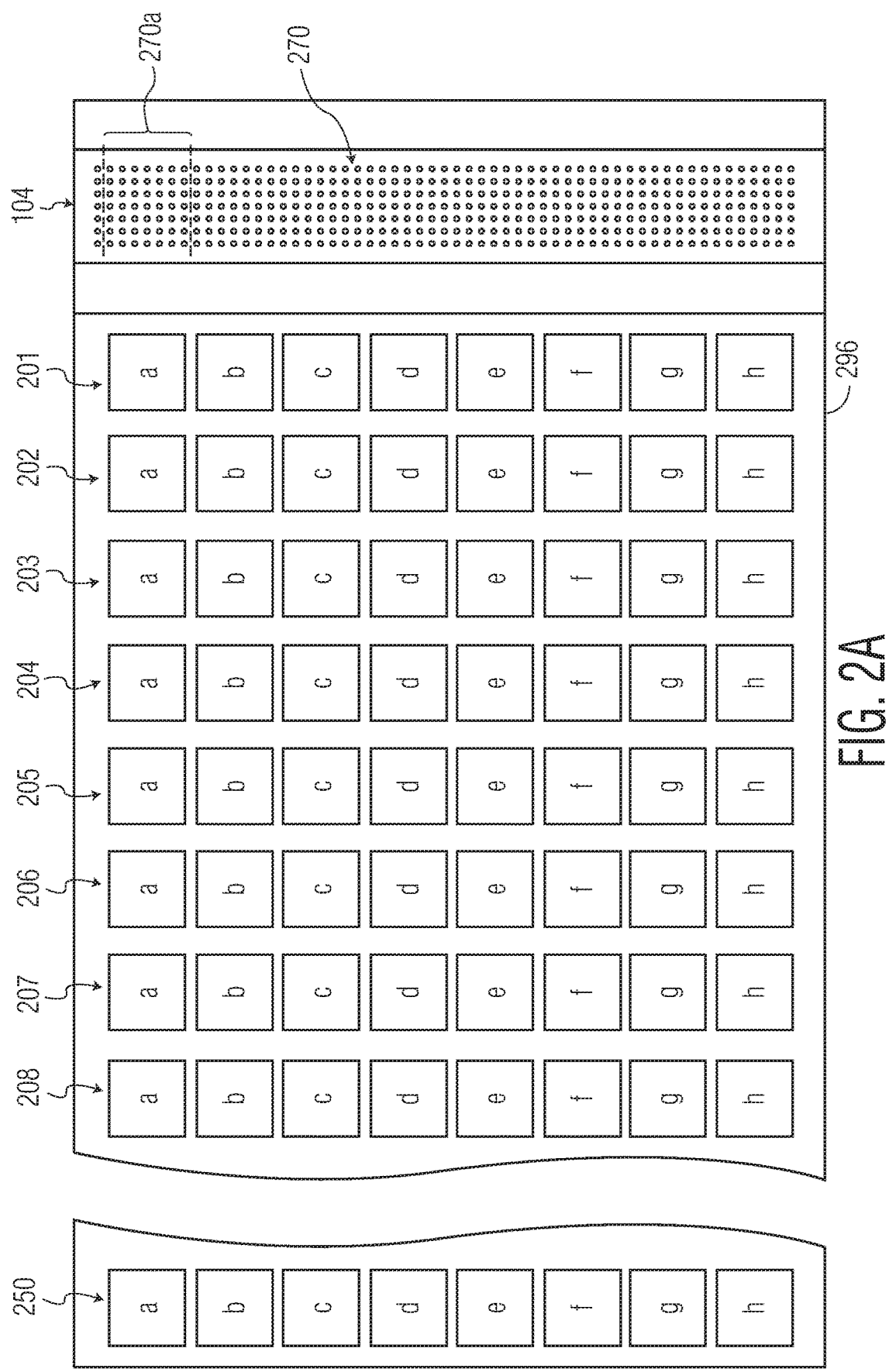
FIG. 2A is an block diagram top view of a substrate and an alignment structure of a bonding machine in accordance with an exemplary embodiment of the present invention.

FIG. 2A is a detailed partial view of substrate 296 supported by support structure 102 (support structure 102 is not visible in FIG. 2A, but see FIG. 1A). Substrate 296 (e.g., a leadframe, a semiconductor wafer, a BGA substrate, etc.) includes a plurality of rows and columns of bonding locations. More specifically, exemplary substrate 296 includes 50 columns (i.e., columns 201, 202, 203, 204, 205, 206, 207, 208, . . . , 250) and 8 rows (i.e., rows a, b, c, d, e, f, g, and h) for a total of 400 bonding locations. At the intersection of each row and column is a bonding location marked by the relevant row (e.g., a, b, c, etc.). Each of the bonding locations may be a portion of a substrate (e.g., a portion of a leadframe, a chip location on a wafer, a chip location on another substrate, etc.), or a semiconductor element (e.g., a die) configured to receive another semiconductor element bonded thereto (e.g., in a stacked die configuration), or any other type of bonding location configured to receive a semiconductor element. Alignment structure 104 includes first alignment markings 270, a portion of which are labelled 270a.

Figure 2B:
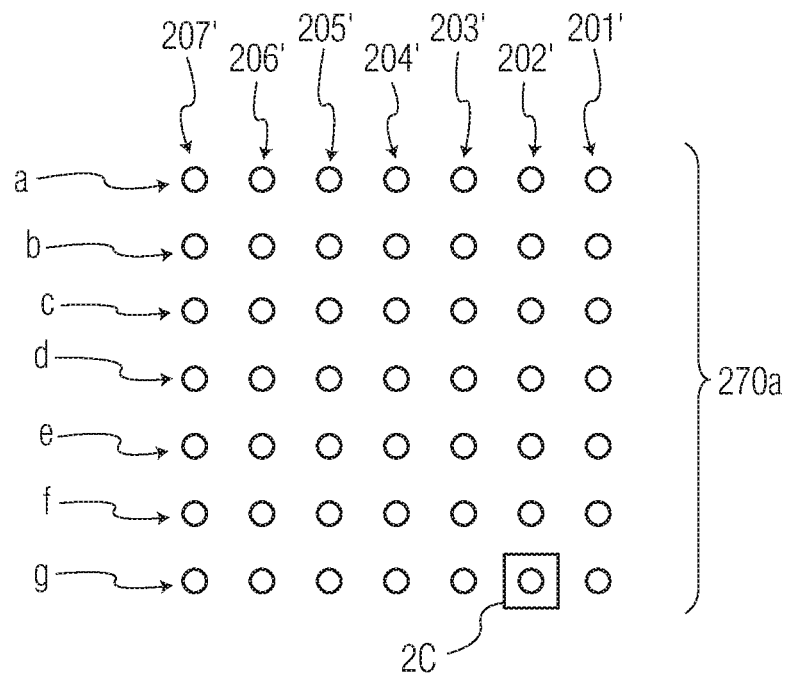
FIG. 2B is a detailed view of a portion of the alignment structure of FIG. 2A.
Figure 2C:
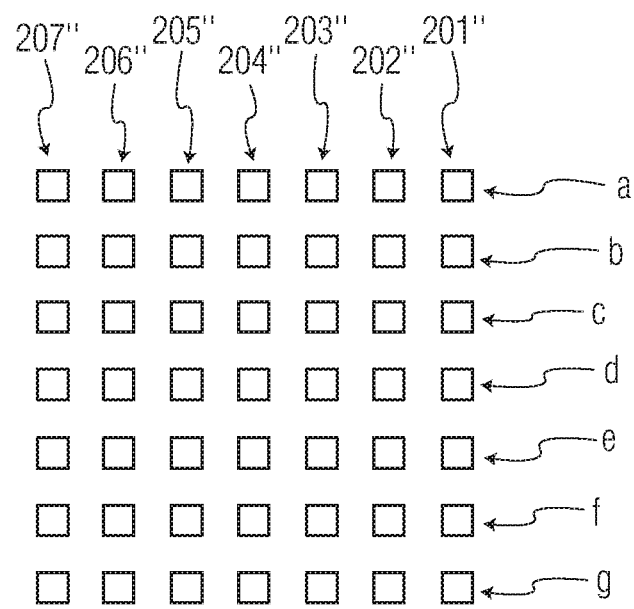
FIG. 2C is a detailed view of a portion of FIG. 2B.

FIG. 2B is a detailed view of portion 270a of first alignment markings 270. Portion 270a includes 7 columns (i.e., columns 201', 202', 203', 204', 205', 206', and 207') and 7 rows (i.e., rows a, b, c, d, e, f, and g) of first alignment markings 270. For example, a first alignment marking (labeled "2C" in FIG. 2B) is at the intersection of column 202' and row g and is illustrated in greater detai in FIG. 2C. As will be appreciated by those skilled in the art, each of the first alignment markings 270 (including the marking detailed in FIG. 2C) may actually be a plurality of markings. For example, FIG. 2C illustrates that the single marking labelled "2C" in FIG. 2B is actually a plurality of markings arranged in 7 columns (i.e., columns 201", 202", 203", 204", 205", 206", and 207") and 7 rows (i.e., rows a, b, c, d, e, f, and g).

Figure 3A:
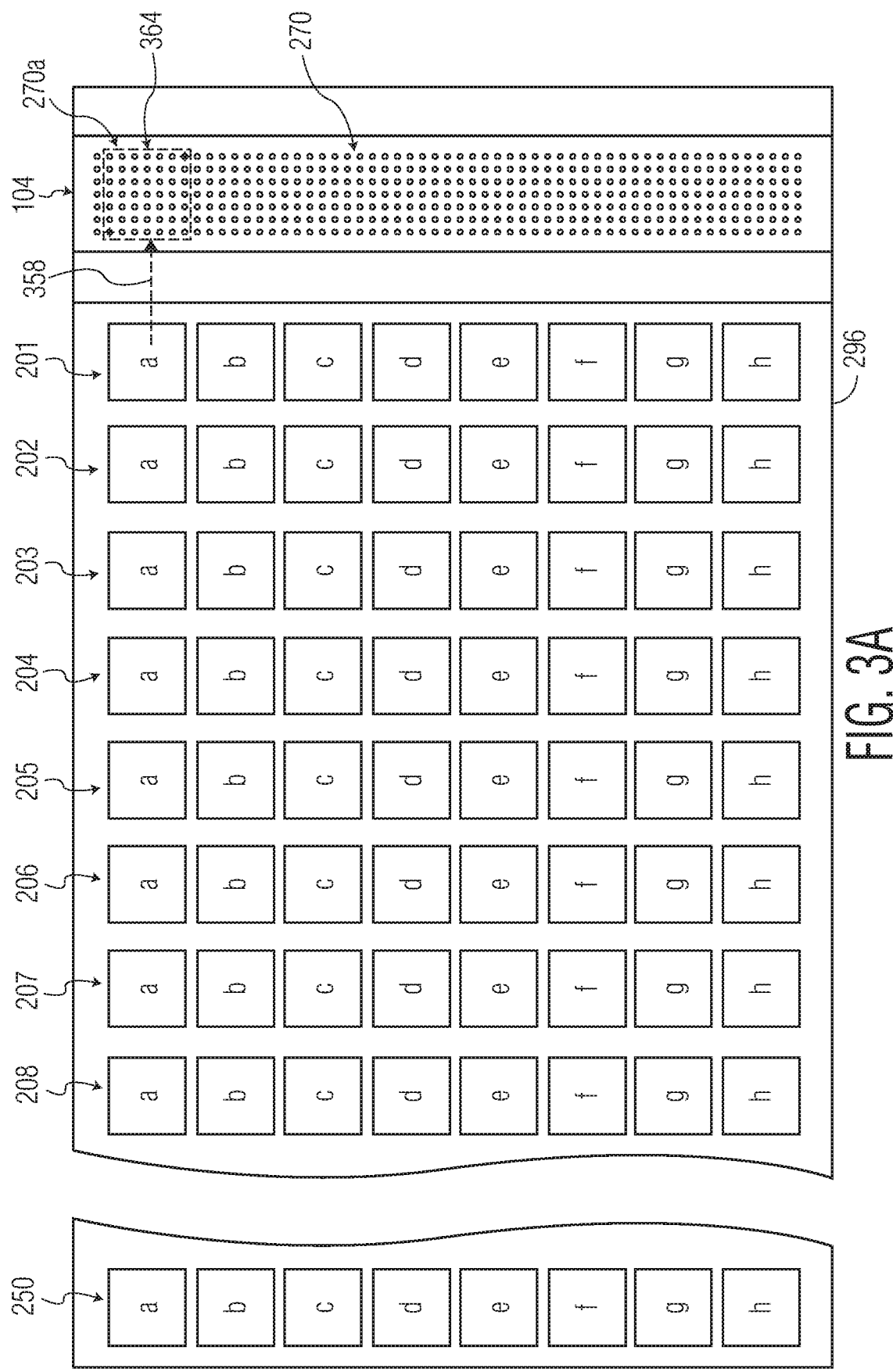
FIG. 3A is an block diagram top view of the apparatus of FIG. 2A with an alignment element disposed on the alignment structure, in accordance with an exemplary embodiment of the present invention.

In FIG. 3A, alignment element 364 (e.g., a transparent glass die) has been placed on an area of alignment structure 104 (i.e., the area including portion 270a of first alignment markings 270). For example, a bonding tool (e.g., a place tool) carried by bond head assembly 106 places alignment element 364 on a designated area of alignment structure 104. More specifically, an alignment element (such as element 364) may be placed on different locations of alignment structure 104. The different locations are selected, for example, based on a corresponding region of a substrate (e.g., such as a row of bonding locations of substrate 296). As noted above, alignment element 364 may be transparent (e.g., glass) (or at least translucent) to facilitate imaging of the respective alignment markings on alignment structure 104. More specifically, if the alignment element 364 is transparent (or at least partially translucent) then the second alignment markings on element 364 may be imaged (e.g., using imaging system 174) with respect to a respective portion of the first alignment markings on alignment structure 104.

Figure 3B:
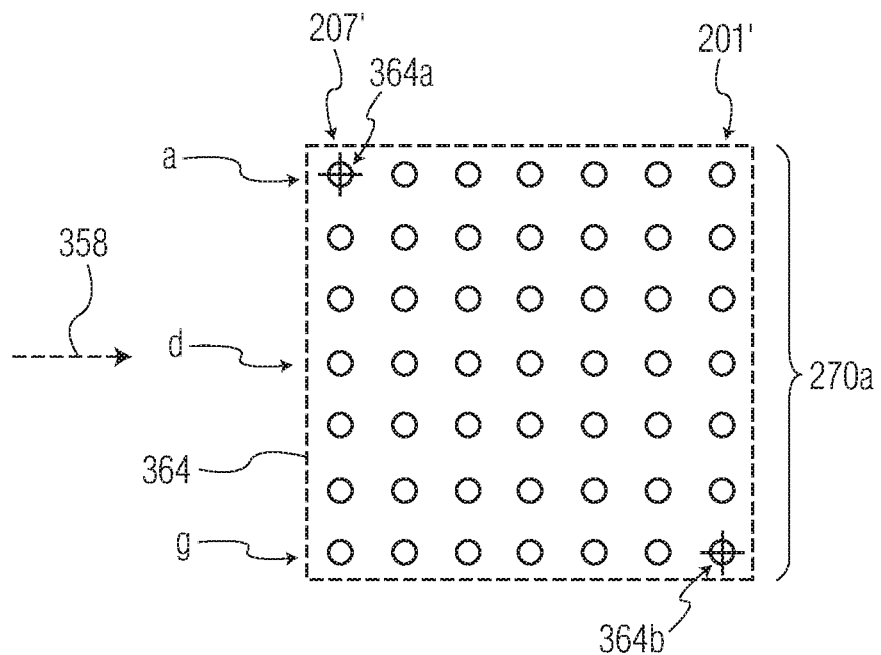
FIGS. 3B-3E are top views of various alignment elements placed over a portion of the alignment structure illustrated in FIG. 3A in accordance with various exemplary embodiments of the present invention.

In the example illustrated in FIG. 3A, and in connection with bonding semiconductor elements in row "a" of substrate 296—it may be desirable to determine if an adjustment needs to be made to the locations of the bonding tool and/or support structure when bonding respective semiconductor elements to bonding locations 201a-250a in row "a". That is, certain errors (e.g., positioning of the bonding tool) may be common (or at least partially common) to each row "a"-"h". Therefore, an alignment may be performed for each such row (or other region) of bonding locations. Following such an alignment, an adjustment (e.g., an adjustment to the x, y, or theta (θ) positioning of the bonding tool and/or the support structure) specific to the region (e.g., row) may be made when bonding semiconductor elements to that region (row) of the substrate. In this regard, a portion of alignment markings 270 on alignment structure 104 are selected corresponding to each region. Referring again to FIG. 3A, a center point of row "a" of substrate 296 is in line with a location of alignment structure 104 (e.g., see arrow 358). For example, the center point of row "a" is substantially in line with row "d" of portion 270a (e.g., see FIG. 3B) of first alignment markings 270. In such an example, row "d" of portion 270a may be selected as the closest row of portion 270a that aligns with the center point of row "a" of substrate 296. That is, when alignment element 364 is placed on alignment structure 104 (during the process of determining adjustments that may be made for row "a") it is placed as shown in FIGS. 3A-3B to determine if the alignment between ones of first alignment markings 270a and the second alignment markings on alignment structure 364 is adequate. For example, such placement may be made using a known coordinate system of the machine and machine placement system. If the alignment is not within a predetermined tolerance (e.g., as determined in the specific application using an algorithm in memory of computer system 176) then an adjustment may be determined when bonding semiconductor elements to bonding locations in row "a".

FIG. 3B is a detailed view of alignment element 364 placed on alignment structure 104 as shown in FIG. 3A. As shown in FIG. 3B, cross-shaped alignment markings 364a, 364b of alignment element 364 (referred to herein as second alignment markings) are aligned with respective ones of first alignment markings 270 (specifically, aligned with the center of circles 207'a, 201'g) within portion 270a of alignment structure 104. As shown in FIG. 3B there is substantial alignment (e.g., as determined by software of computer system 176 by processing image data provided by imaging system 174) and no adjustment needs to be made during bonding for any of the bonding locations 201a-250a (in row "a" of FIG. 3A).

Alignment element 364 may be stored in a location, for example, proximate, or on, bond head assembly 106 during bonding operations. So the bonding tool may then return alignment element 364 to that location. The bonding tool may then obtain semiconductor elements from pick tool 110 at the transfer position (see, e.g., FIG. 1A), and bond the semiconductor elements to respective bonding locations 201a-250a (or any portions thereof) with any positional correction being applied to bond head assembly 106 (and thus the bonding tool) and/or support structure 102 for each bond. Again, in this example, there would be zero correction during bonding along row "a" of FIG. 3A. The alignment and bonding processes described above may be repeated for each subsequent row "b"-"h" of FIG. 3A, with any positional correction for each row applied by the bonding tool (e.g., using bond head assembly 106) and/or support structure 102 before bonding semiconductor elements to that row's bonding locations (e.g., 201b-250b for row "b", 201c-250c for row "c", etc.).

Figure 3C:
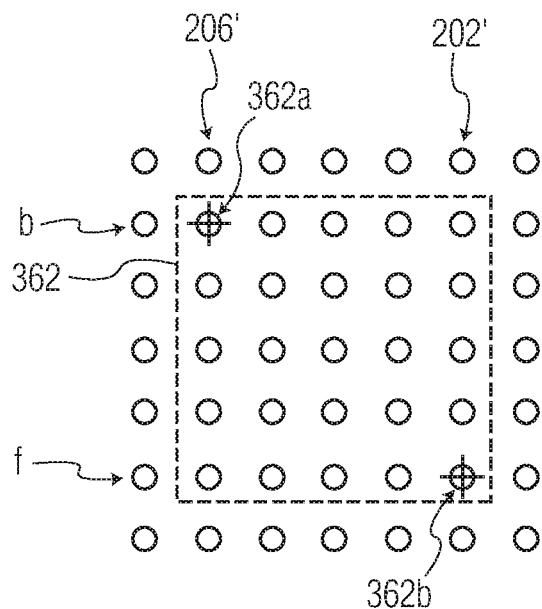
Figure 3D:
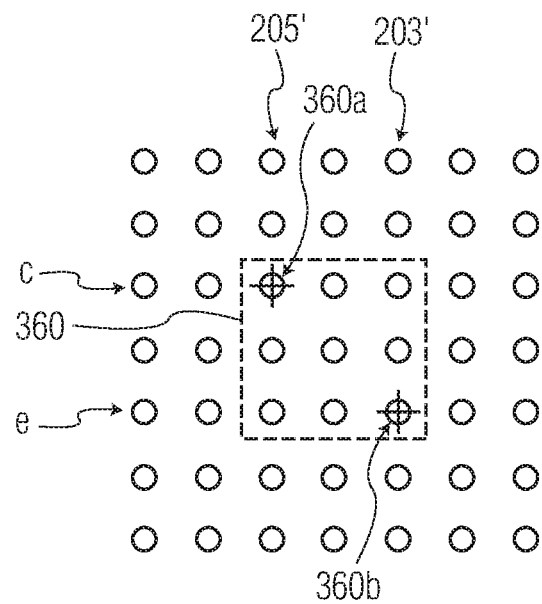

FIGS. 3C-3D illustrate other exemplary alignment elements 362, 360 of decreasing size that may correlate to the size of bonding locations (e.g, 201a-250h) and/or the size of the semiconductor elements to be bonded to such bonding locations. Specifically, alignment element 362, illustrated in FIG. 3C over a portion of first alignment markings 270, includes second alignment markings 362a, 362b at opposing corners thereof (i.e., over first alignment markings 206'b, 202'f, respectively). Smaller alignment element 362 overlies a 5×5 grid of first alignment markings as compared to the 7×7 grid of first alignment markings illustrated in FIG. 3B. Smallest alignment element 360 illustrated in FIG. 3D over a portion of first alignment markings 270, includes second alignment markings 360a, 360b at opposing corners thereof (i.e., over first alignment markings 205'c, 203'e, respectively), and overlies a 3×3 grid of first alignment markings. By providing various different alignment elements (e.g., elements 360, 362, 364) with different sizes and/or alignment marking configurations, it is clear that varying applications (e.g., bonding of semiconductor elements of varying sizes) may be accommodated.

Figure 3E:
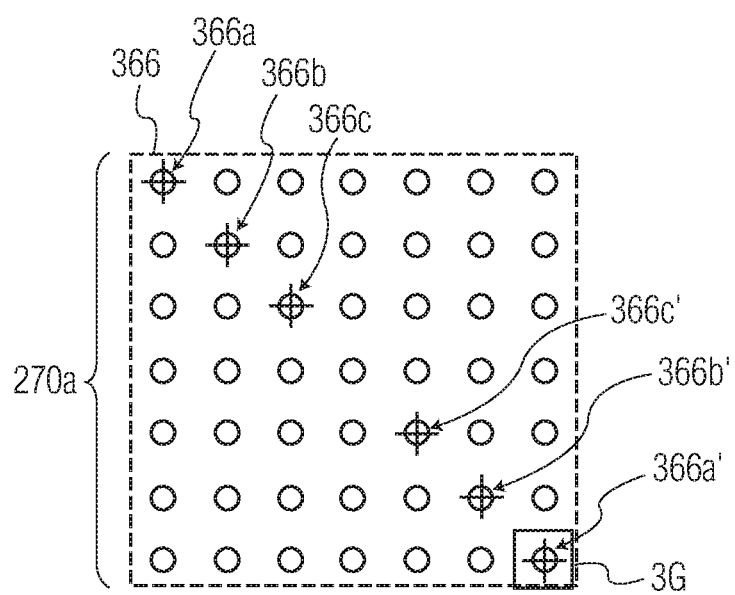
Figure 3F:
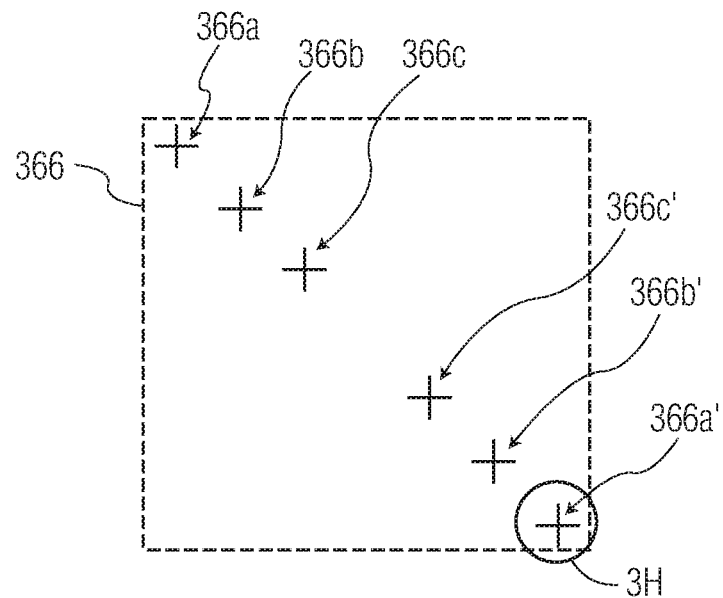
FIG. 3F is a top view of the alignment element of FIG. 3E.

While FIGS. 3B, 3C, and 3D illustrate three distinct alignment elements with specific alignment marking configurations, it is possible to accommodate varying applications with a single alignment element. For example, FIG. 3E illustrates alignment element 366 placed over a portion 270a of first alignment markings 270 of alignment structure 104. Alignment element 366 includes, in effect, three series of second alignment marking pairs 366a, 366a'; 366b, 366b'; 366c, 366c'. Thus, alignment element 366 could be used in connection with three different configurations of devices, essentially replacing the need for using distinct alignment elements 360, 362, and 364 with a single structure. Of course, this is simply an illustration of the broader intent, that is, a single alignment element may be used with a plurality of sets of alignment markings for a plurality of applications. FIG. 3F illustrates alignment element 366 away from markings 270a of alignment structure 104.

First alignment markings 270, and second alignment markings (e.g., markings 360a, 360b, 362a, 362b, 364a, 364b, 366a-366c, and 366a'-366c') as illustrated herein are exemplary in nature. That is, the markings are not limited to the style shown and described herein, the number shown and described herein, or the orientation shown and described herein. In practice, the first and second alignment markings may be very different than those shown and described with respect to, for example, FIGS. 3B-3E. For example, each of the markings included in group 270a may actually include a plurality of markings. As provided above, in a specific example, the single mark labelled "2C" in FIG. 2B actually represents the group of markings shown in FIG. 2C. Likewise, each of the second alignment markings (e.g., 366a, 366a', 366b, 366b', 366c, 366c') may also represent a group of markings. Thus, it is understood that in FIG. 3B (and in other drawings herein) that the actual alignment of second alignment markings 364a, 364b with ones of the first alignment markings included in group 270a is illustrative and may not actually represent the actual alignment. That is, it illustrates that the markings (whatever they actually represent) are aligned. This point is further illustrated below by reference to FIGS. 3G-3H.

Figure 3G:
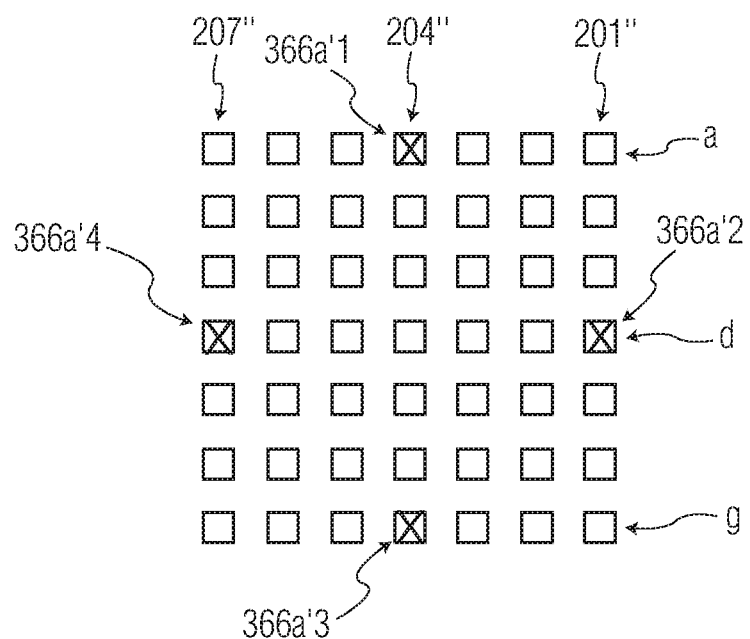
FIG. 3G is a detailed view of portion 3G of FIG. 3E.
Figure 3H:
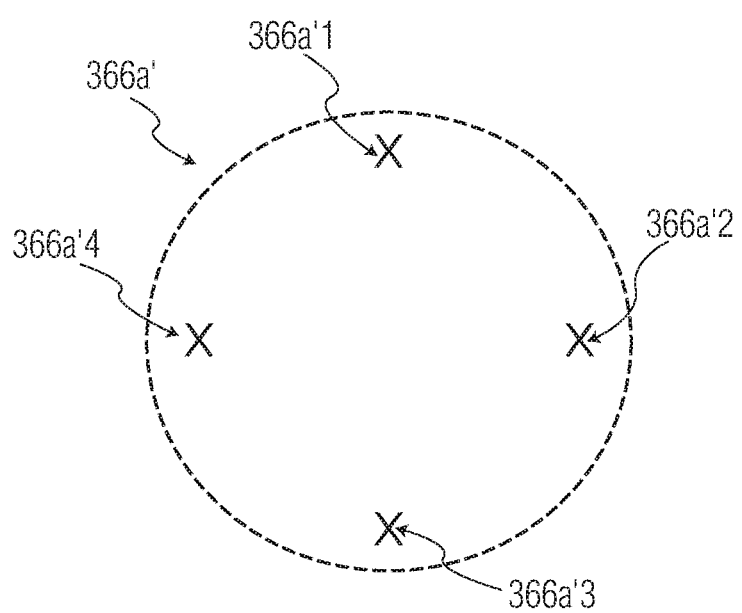
FIG. 3H is a detailed view of portion 3H of FIG. 3F.

FIG. 3G is a detailed view of the portion of FIG. 3E labeled "3G", and FIG. 3H is a detailed view of the portion of FIG. 3F labelled "3H". In FIG. 3E, the second alignment marking 366a' is shown as a cross-shaped marking centered over one of circular alignment markings 270 included in group 270a. In the detailed view of FIG. 3H, second alignment marking 366a' is actually a group of 4 X-shaped markings 366a'1, 366a'2, 366a'3, and 366a'4 (referred to herein as third alignment markings). Thus, the cross-shaped marking 366a' is just a representation of the actual marking which is a group of third alignment markings 366a'1, 366a'2, 366a'3, and 366a'4. Likewise, the circular alignment marking of group 270a (labelled as "3G" in FIG. 3E) is actually a group of rectangular shapes (referred to herein as fourth alignment markings) shown in FIG. 3G (i.e., where the group includes 7 rows and 7 columns of rectangles; with 3 rows labelled as a, d, and g; and 3 columns labelled as 201", 204", and 207"). Thus, FIG. 3G actually illustrates four third alignment markings 366a'1, 366a'2, 366a'3, and 366a'4 aligned with four fourth alignment markings 204"a, 201"d, 204"g, and 207"d. This is a more detailed way of illustrating what is shown in detail "3G" of FIG. 3E—that is, second alignment marking 366a' is properly aligned with the corresponding first alignment marking.

Figure 4A:
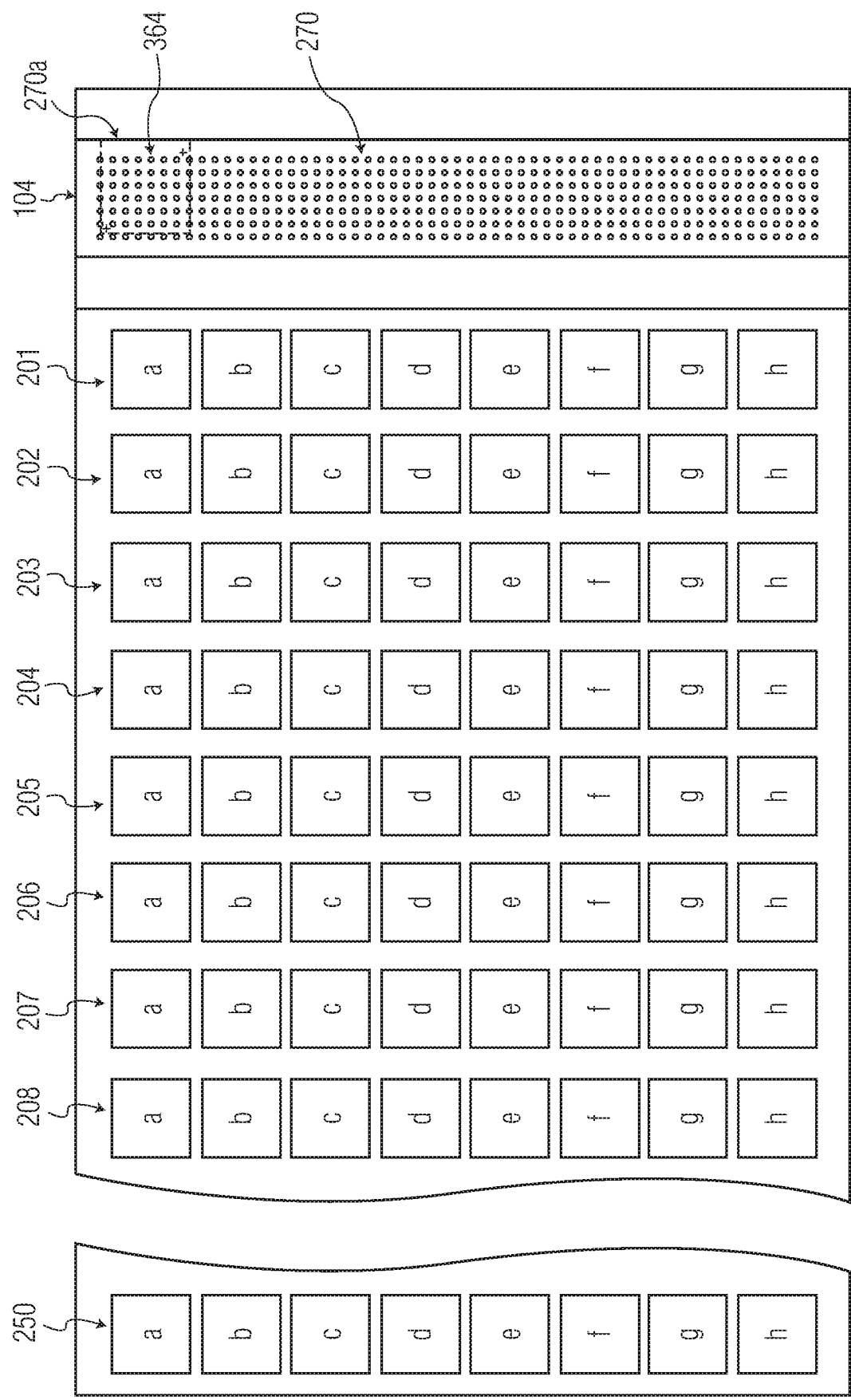
FIG. 4A is a block diagram top view of the apparatus of FIG. 2A with a misaligned alignment element disposed on the alignment structure, in accordance with an exemplary embodiment of the present invention.
Figure 4B:
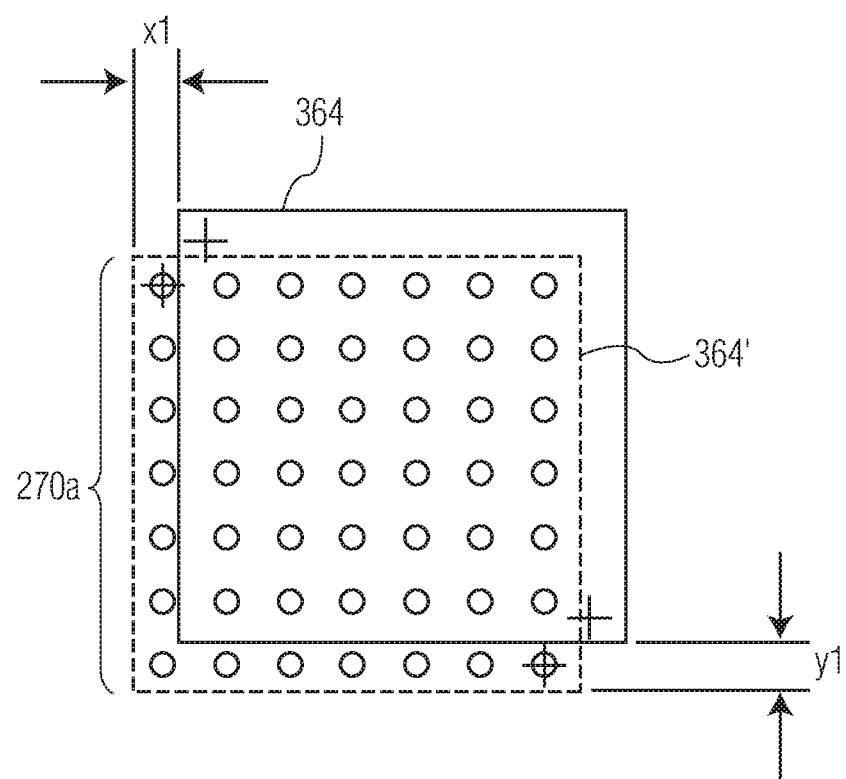
FIG. 4B is a detailed top view of the misaligned alignment element of FIG. 4A.
Figure 5A:
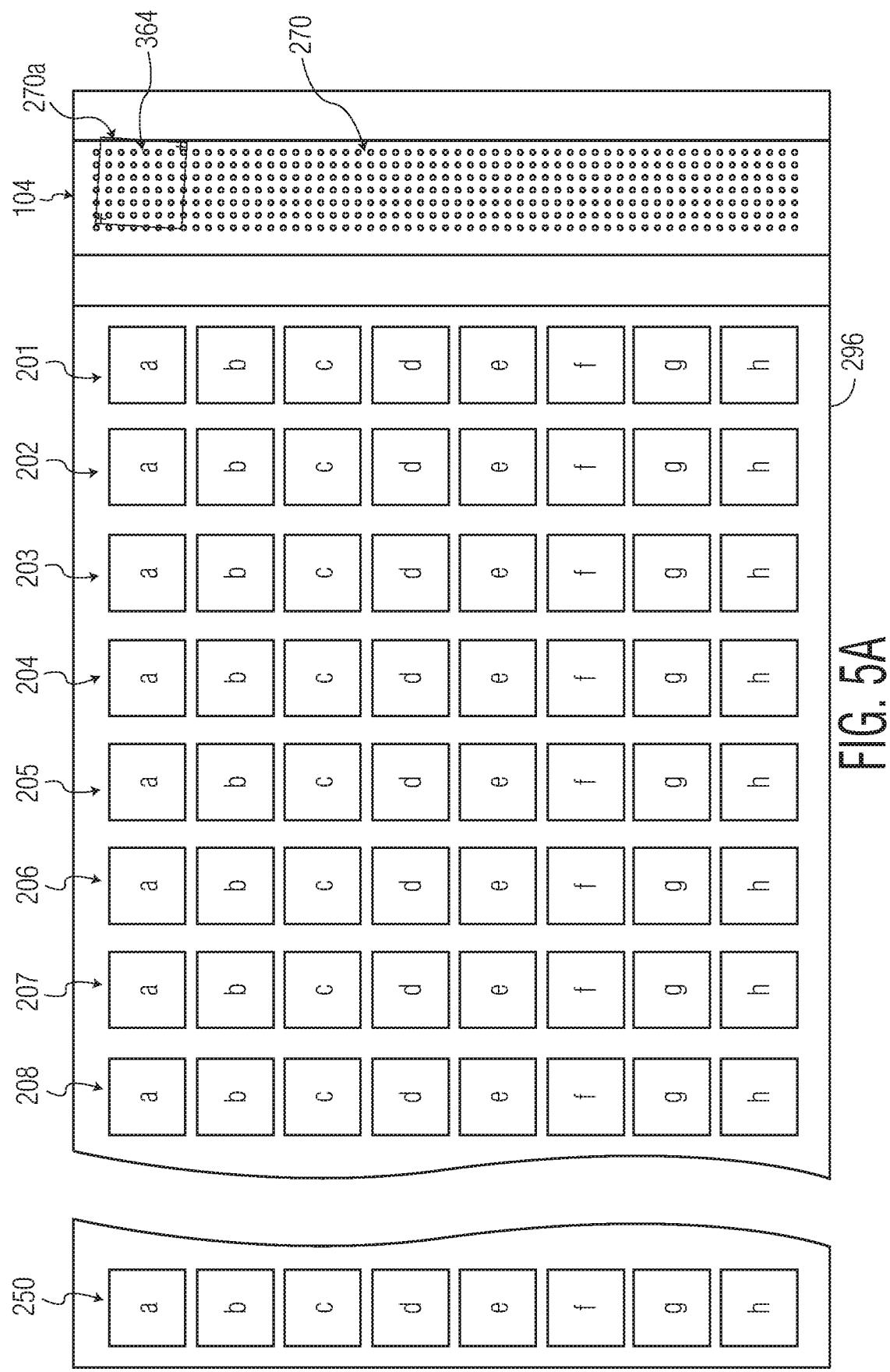
FIG. 5A is another block diagram top view of the apparatus of FIG. 2A with another misaligned alignment element disposed on the alignment structure, in accordance with an exemplary embodiment of the present invention.

In contrast to FIG. 3A (which illustrates a properly aligned alignment element 364 over markings 270a), FIG. 4A and FIG. 5A illustrate examples where the respective alignment element is not properly aligned, thereby resulting in an adjustment to the bonding tool and/or the support structure when bonding devices in that region (e.g., the row of bonding locations). Referring specifically to FIG. 4A, alignment element 364 has been placed over alignment structure 104 by the bonding tool (or place tool) in, what bonding machine 100 has been taught, is an aligned position over portion 270a of first alignment markings 270 corresponding to row "a" of the bonding locations. However, as illustrated in FIG. 4A, and more clearly seen in FIG. 4B, alignment element 364 is in a misaligned position. As illustrated in FIG. 4B, misaligned alignment 364 is shown in solid-line, while the properly aligned position is shown in dashed-line and is labelled as 364'. In this example, alignment structure 364 is misaligned in both an x-direction and a y-direction as determined using an image(s) provided by an imaging device (e.g. a camera) of imaging system 174 positioned over actual alignment element 364. Through image processing (e.g., using software installed on computer system 176) it is determined that the second alignment markings (i.e., the cross-shaped symbols shown in FIG. 4B) of alignment element 364 are misaligned from the corresponding ones of first alignment markings 270 (i.e., the circular shaped symbols shown in FIG. 4B). Thus, it is determined that alignment element 364 is misaligned by an amount shown as "x1" in the x-axis direction, and by an amount shown as "y1" in the y-axis direction. Computer system 176 calculates or otherwise determines (e.g., using algorithms or the like) adjustments to be made to (1) the bonding tool position through bond head assembly 106 (e.g., an offset equal to an adjustment of y1 along the y-axis), and support structure 102 (e.g., an offset equal to an adjustment of x1 along the x-axis), to properly place and align (and to subsequently bond) the semiconductor elements from semiconductor element source 108 on bonding locations 201a-250a within row "a". This procedure may then be repeated for each subsequent bonding location row "b"-"h" to be bonded with adjustments made, if needed, in each bonding row to be bonded (e.g, 201b-250b, 201c-250c, . . . 201h-250h).

Figure 5B:
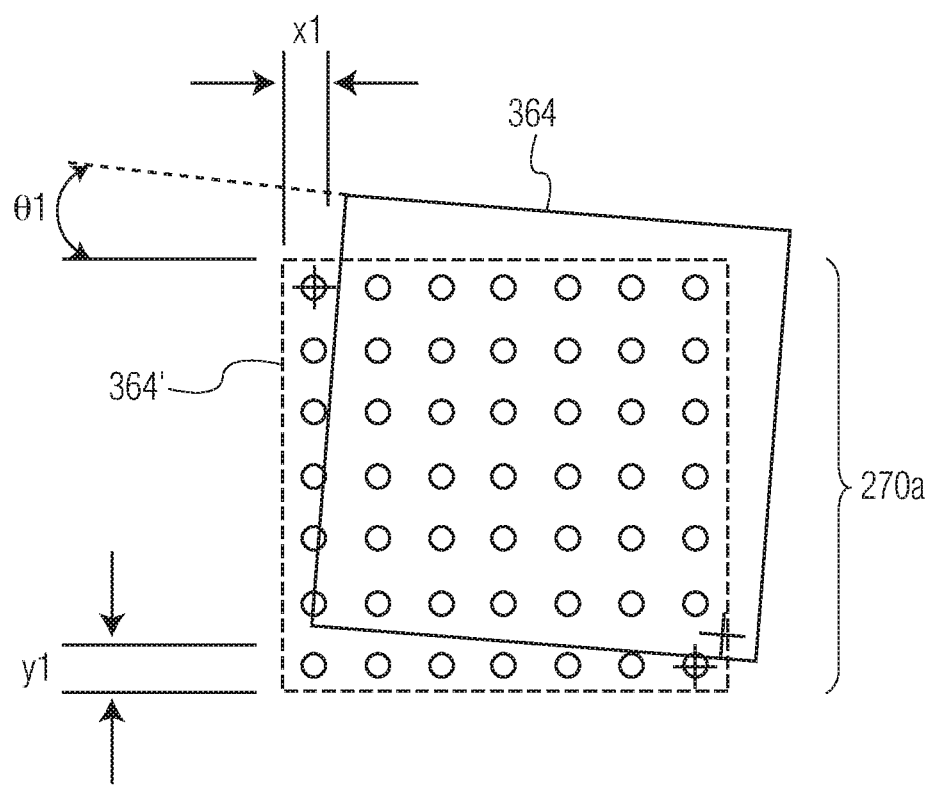
FIG. 5B is a detailed top view of the misaligned alignment element of FIG. 5A.

Referring specifically to FIG. 5A, alignment element 364 has been placed over alignment structure 104 by the bonding tool. As illustrated in FIG. 5A, and more clearly seen in FIG. 5B, alignment element 364 is in a misaligned position. As illustrated in FIG. 5B, misaligned alignment 364 is shown in solid-line, while the properly aligned position is shown in dashed-line and is labelled as 364'. In this example, alignment structure 364 is misaligned in an x-direction, a y-direction, and about a theta (θ) axis as determined using an image(s) provided by an imaging device (e.g. a camera) of imaging system 174 positioned over actual alignment element 364. Through image processing (e.g., using software installed on computer system 176) it is determined that the second alignment markings (i.e., the cross-shaped symbols shown in FIG. 5B) of alignment element 364 are misaligned from the corresponding ones of first alignment markings 270 (i.e., the circular shaped symbols shown in FIG. 5B). Thus, it is determined that alignment element 364 is misaligned by an amount shown as "x1" in the x-axis direction, by an amount shown as "y1" in the y-axis direction, and by an amount shown as θ1 about the theta (θ) axis. Computer system 176 calculates or otherwise determines (e.g., using algorithms or the like) adjustments to be made to (1) the bonding tool position through bond head assembly 106 (e.g., an offset equal to an adjustment of y1 along the y-axis, and θ1 about the theta axis), and (2) support structure 102 (e.g., an offset equal to an adjustment of x1 along the x-axis), to properly place and align (and to subsequently bond) the semiconductor elements from semiconductor element source 108 on bonding locations 201a-250a within row "a". This procedure may then be repeated for each subsequent bonding location row "b"-"h" to be bonded with adjustments made, if needed, in each bonding row to be bonded (e.g, 201b-250b, 201c-250c, . . . 201h-250h).

Figure 6A:
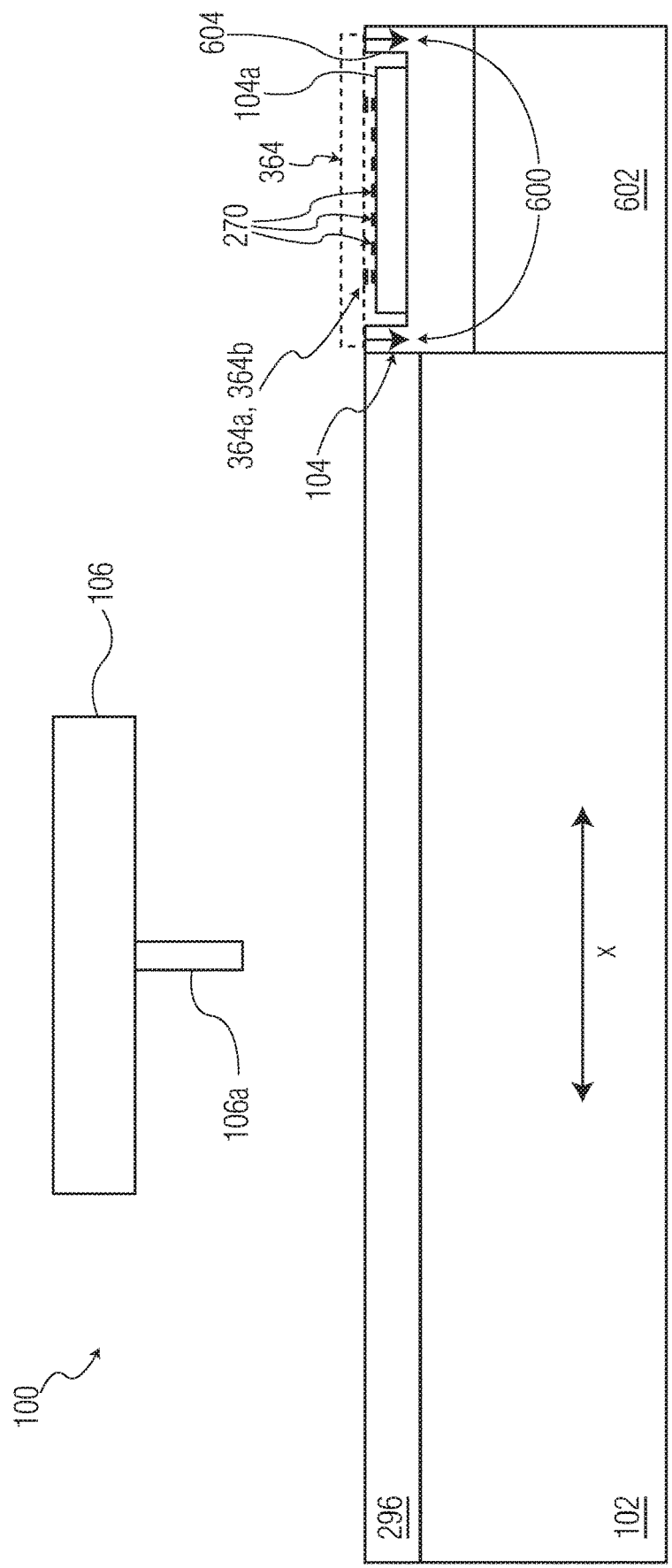
FIG. 6A is a partial sectional block diagram view of portions of the bonding machine of FIG. 1A in accordance with an exemplary embodiment of the present invention.

FIG. 6A illustrates portions of bonding machine 100 (previously illustrated and described with respect to FIG. 1A, but with certain additional elements shown, and with certain elements removed, in FIG. 6A). Bonding machine 100 includes bond head assembly 106 (carrying bonding tool 106a which has placed alignment element 364 on alignment structure 104) and support structure 102 (supporting substrate 296). Substrate 296 has been illustrated and described above with respect to FIGS. 2A, 3A, 4A, and 5A. Alignment structure 104 (illustrated with additional detail compared to the prior drawings) is supported by underlying support bracket 602 so as to move with support structure 102 along its motion axis (or axes). Alignment structure 104 defines trench 604 and includes alignment marking structure 104a (while shown as separate elements in FIG. 6A, it is understood that alignment marking structure 104a may be integrated with the remainder of alignment structure 104 as a single structure). The upper surface of alignment marking structure 104a (which includes first alignment markings 270 thereon) is below the top of trench 604. Alignment element 364 (e.g., a glass die, shown in dotted lines) is placed over alignment structure 104 and held in place by a holding force provided by holding system 600 (e.g, a vacuum source providing a vacuum force, a magnetic source providing a magnetic force, etc.) pulling down and holding alignment element 364 in place on a top surface of alignment structure 104. The lower surface of alignment element 364 (e.g., having second alignment markings 364a, 364b thereon) is spaced apart from the upper surface of marking structure 104a, with second alignment markings 364a, 364b aligned (e.g., as shown in FIGS. 3A, 4A, and 5A) with a respective portion of first alignment markings 270. Alignment element 364 is desirably transparent (or at partially transparent or translucent) to facilitate imaging the second alignment marks 364a, 364b and the respective ones of first alignment markings 270 (along a z-axis) using imaging system 174 (e.g., see FIG. 1A). This alignment information is processed by computer system 176 (e.g., see FIG. 1A) as described above.

Figure 6B:
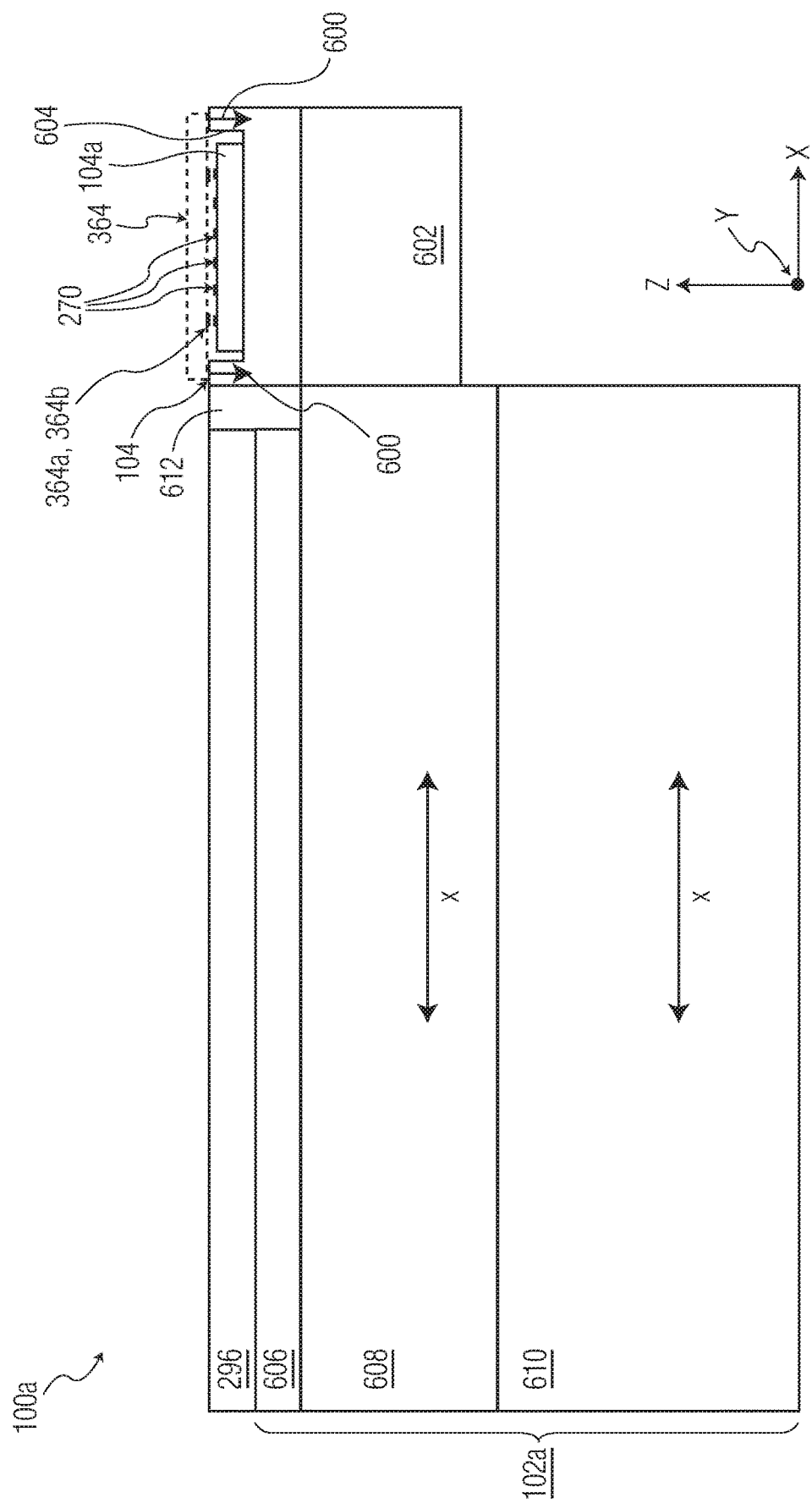
FIG. 6B is a partial sectional block diagram view of portions of another bonding machine in accordance with an exemplary embodiment of the present invention.

Of course, the illustration of bonding machine 100 in FIG. 6A (as well as the other drawings shown herein) are exemplary in nature, and many changes may be made as desired in the specific application within the scope of the present invention. One change that may be made relates to support structure 102. As described above, support structure 102 may take various configurations such as a shuttle, a heated shuttle, a heat block, an anvil, etc. FIG. 6B illustrates bonding machine 100a (with like elements having the same reference numbers) which is different from bonding machine 100 shown in FIGS. 1A and 6A, primarily with respect to the support structure.

In FIG. 6B, support structure 102a includes application specific chuck 606 (which may be heated), fine x-axis motion system 608, and shuttle 610. In the illustrated embodiment, shuttle 610 is configured to be the "coarse" x-axis motion system, while motion system 608 (carried by shuttle 610) is a "fine" x-axis motion system. Motion system 608 carries chuck 606. Thermal insulator 612 separates chuck 606 (as well as substrate 296) from alignment structure 104 to prevent/minimize heat transfer therebetween.

As provided above (e.g., in connection with FIG. 1A) the specific motion systems of the various elements may vary widely. In one embodiment (shown in FIG. 1A) bond head assembly 106 moves along the y-axis and about the θ-axis (theta). In this embodiment, motion along the x-axis is provided by support structure 102 (and in the case of FIG. 6B, by either of motion system 608 and/or shuttle 610, of support structure 102a). Thus, in order to make an adjustment (e.g., as determined by the processes described herein such as the x-axis, y-axis, and θ-axis adjustments determined to be needed in FIG. 5B) the corresponding motion system can make the adjustment. Referring to the adjustments mentioned above in connection with FIG. 5B, bond head assembly 106 may make the y-axis and θ-axis adjustment, while support structure 102 (or support structure 102a in FIG. 6B, such as through motion system 608) may make the x-axis adjustment.

As will be appreciated by those skilled in the art, an exemplary machine architecture has been described herein, wherein adjustments to the x-axis are made through motion of the support structures described herein (including but not limited to motion of fine x-axis motion system 608 in FIG. 6B), while adjustments to the y-axis or theta axis are made by the bond head assembly. However, this is just an exemplary machine architecture. In another example, the bond head assembly could have an additional motion axis along the x-axis, thereby enabling adjustments along the x-axis, y-axis, and about the theta axis. In yet another example, the support structure could have an additional motion axis along the y-axis, thereby enabling adjustments along the x-axis and y-axis. Of course, many other exemplary architectures are possible.

In summary, and by reference to the exemplary architectures disclosed herein, after completing the alignment process (such as described above in connection with FIGS. 3A-3H, 4A-4B, and 5A-5B) for all desired regions of the substrate (e.g., all rows of bonding locations of the substrate)—the bonding of the semiconductor elements may begin. For example, in order to bond a given semiconductor device to a corresponding bonding location of a substrate, an imaging system (e.g., system 174, which may include an up/down camera system to image above and below) may image the semiconductor element held by the place tool, and may image the bonding location, in preparation for bonding. This imaging provides placement information for the bonding of the semiconductor element to the bonding location. However, additional adjustments (dependent on the region of the substrate being bonded) to the bonding tool and/or support structure positions may be made before bonding in accordance with the present invention as described herein.

After bonding of this semiconductor element, the process continues, with imaging of a subsequent semiconductor device and bonding location, etc.

While the present invention has been described largely in connection with a substrate (e.g., substrate 296) having rows and columns of bonding locations, wherein the alignment is accomplished row by row, it is not limited thereto.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding machine for bonding semiconductor elements, the bonding machine comprising:
    a support structure for supporting a substrate;
    a bond head assembly, the bond head assembly including a bonding tool configured to bond a plurality of semiconductor elements to the substrate;
    an alignment structure including first alignment markings;
    an alignment element placed on a selected area of the alignment structure using the bonding tool, the alignment element including second alignment markings;
    an imaging system imaging ones of the second alignment markings on the alignment element along with ones of the first alignment markings on the area of the alignment structure, after placement of the alignment element on the alignment structure using the bonding tool, to provide relative positions of the first alignment markings and corresponding ones of the second alignment markings; and
    a computer system providing an adjustment to a position of at least one of the bonding tool and the support structure during bonding of ones of the plurality of semiconductor elements to the substrate, the computer system providing the adjustment using the relative positions of the first alignment markings and the corresponding ones of the second alignment markings from the imaging system, the adjustment being specific to bonding of the ones of the plurality of semiconductor elements to a corresponding region of the substrate.

2. The bonding machine of claim 1 wherein the adjustment is specific to a y-axis position of the substrate.

3. The bonding machine of claim 1 wherein the adjustment is specific to an x-axis position of the substrate.

4. The bonding machine of claim 1 wherein the alignment element is at least partially transparent such that the first alignment markings of the alignment structure are visible to the imaging system when the alignment element is positioned above the first alignment markings.

5. The bonding machine of claim 1 wherein the alignment structure is secured to the support structure.

6. The bonding machine of claim 1 further comprising a motion system for moving the support structure along a horizontal axis of the bonding machine, the alignment structure being secured to the support structure such that the alignment structure is moved along the horizontal axis with the support structure.

7. The bonding machine of claim 1 wherein a separation is defined between a portion of the alignment element and the alignment structure.

8. The bonding machine of claim 1 wherein the alignment element is configured to be held on the alignment structure using a holding force.

9. The bonding machine of claim 8 where the holding force is provided by at least one of a vacuum force and a magnetic force.

10. The bonding machine of claim 1 wherein the second alignment markings of the alignment element are configured to be aligned with the first alignment markings of the alignment structure.

11. The bonding machine of claim 1 wherein the corresponding ones of the second alignment markings include groups of markings, each of the groups of markings being configured for alignment with a corresponding portion of the first alignment markings.

12. The bonding machine of claim 1 wherein a portion of the second alignment markings are selected to be aligned with a corresponding portion of the first alignment markings based upon a size of bonding areas of the substrate.

13. The bonding machine of claim 1 wherein the corresponding region of the substrate is a row of bonding areas of the substrate.

14. The bonding machine of claim 1 wherein the corresponding region of the substrate is a column of bonding areas of the substrate.

15. The bonding machine of claim 1 wherein the alignment element comprises glass.

16. The bonding machine of claim 14 wherein after placement of the alignment element on the alignment structure, the first alignment markings are provided on a top surface of the alignment structure, and the second alignment markings are provided on a bottom surface of the alignment element.

* * * * *